(12) United States Patent
Song et al.

(10) Patent No.: US 10,431,773 B2
(45) Date of Patent: Oct. 1, 2019

(54) ORGANIC LIGHT EMITTING DISPLAY DEVICE

(71) Applicant: LG Display Co., Ltd., Seoul (KR)

(72) Inventors: Eun Ah Song, Seoul (KR); Hyun Tae Byun, Gimpo-si (KR); Jung Gi Kim, Seoul (KR); Kwang Nam Cho, Uijeongbu-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/669,641

(22) Filed: Aug. 4, 2017

(65) Prior Publication Data

US 2018/0076417 A1 Mar. 15, 2018

(30) Foreign Application Priority Data

Sep. 9, 2016 (KR) ........................ 10-2016-0116775

(51) Int. Cl.
*H01L 51/52* (2006.01)
*H01L 27/32* (2006.01)

(52) U.S. Cl.
CPC ...... *H01L 51/5256* (2013.01); *H01L 27/3244* (2013.01); *H01L 51/5253* (2013.01); *H01L 2251/301* (2013.01); *H01L 2251/303* (2013.01); *H01L 2251/558* (2013.01)

(58) Field of Classification Search
None
See application file for complete search history.

(56) References Cited

U.S. PATENT DOCUMENTS

| 2004/0247949 A1* | 12/2004 | Akedo | C23C 16/347 428/704 |
| 2007/0114519 A1* | 5/2007 | Hayashi | H01L 51/5246 257/40 |
| 2007/0132381 A1* | 6/2007 | Hayashi | H01L 51/524 313/512 |
| 2008/0198457 A1* | 8/2008 | Sakai | G02B 1/10 359/507 |
| 2010/0019654 A1* | 1/2010 | Hayashi | H01L 51/5246 313/498 |

(Continued)

FOREIGN PATENT DOCUMENTS

KR 10-2013-0040574 A 4/2013
KR 10-2014-0085087 A 7/2014

*Primary Examiner* — Walter H Swanson
*Assistant Examiner* — Kien C Ly
(74) *Attorney, Agent, or Firm* — Seed IP Law Group LLP

(57) ABSTRACT

Provided is an organic light emitting display device. The organic light emitting display device includes a substrate, an organic light emitting element on the substrate, a first encapsulation layer on the substrate and the organic light emitting element to seal the organic light emitting element, a second encapsulation layer on the first encapsulation layer, a particle cover layer on the second encapsulation layer corresponding to at least an organic light emitting element area, and a third encapsulation layer on the second encapsulation layer and the particle cover layer. The first encapsulation layer and the second encapsulation layer are different from each other in surface energy. When the particle cover layer is coated, the second encapsulation layer may have a higher spreadability. Thus, it is possible to improve scan mura or defect.

29 Claims, 4 Drawing Sheets

(56) References Cited

U.S. PATENT DOCUMENTS

| | | | |
|---|---|---|---|
| 2010/0210047 A1* | 8/2010 | Sasaki | H01L 51/5256 438/26 |
| 2015/0144930 A1* | 5/2015 | Kim | H01L 51/5256 257/40 |
| 2016/0111684 A1* | 4/2016 | Savas | H01L 51/5256 257/40 |
| 2016/0118416 A1* | 4/2016 | Yamazaki | H01L 27/1255 349/38 |
| 2016/0147109 A1* | 5/2016 | Yamazaki | G02F 1/133345 349/42 |
| 2017/0025640 A1* | 1/2017 | Kim | H01L 51/5256 |
| 2017/0256740 A1* | 9/2017 | Xiao | H01L 51/56 |
| 2017/0323936 A1* | 11/2017 | Lee | H01L 27/3262 |
| 2018/0026234 A1* | 1/2018 | Jain | C09D 11/101 438/26 |

* cited by examiner

ORGANIC LIGHT EMITTING DISPLAY DEVICE

CROSS-REFERENCE TO RELATED APPLICATIONS

This application claims the priority of Korean Patent Application No. 10-2016-0116775 filed on Sep. 9, 2016, in the Korean Intellectual Property Office, the disclosure of which is incorporated herein by reference in its entirety.

BACKGROUND

Technical Field

The present disclosure relates to an organic light emitting display device, and more specifically, to an organic light emitting display device including an encapsulation layer.

Description of the Related Art

An organic light emitting display (OLED) device is a self-luminance display device and does not need a separate light source unlike a liquid crystal display device. Accordingly, the OLED device can be made lighter and thinner. In addition, the OLED device is advantageous in terms of power consumption since it is driven with low DC voltage. Also, the OLED device has excellent color expression ability, a high response speed, a wide color viewing angle, and a high contrast ratio (CR). Therefore, the OLED device has been researched as a next-generation display device.

The OLED device includes a plurality of organic light emitting elements each including an anode, an organic light emitting layer, and a cathode. In the organic light emitting layer, lights are emitted with energy generated when excitons formed by combination of electrons and holes transition from an excited state to a ground state. Accordingly, OLED device displays images.

However, despite these advantages, the OLED device has a disadvantage of being very vulnerable to moisture and oxygen. Therefore, it is very important to block permeation of moisture and oxygen from the outside of the OLED device by sealing organic light emitting elements while the OLED device is manufactured.

Thus, in the OLED device, an encapsulation unit in which an inorganic film and an organic film are alternately laminated is disposed on an organic light emitting element in order to effectively block permeation of moisture and oxygen.

BRIEF SUMMARY

An encapsulation layer includes a first encapsulation layer formed of an inorganic film on an organic light emitting element, a particle cover layer formed of an organic film on the first encapsulation layer, and a second encapsulation layer formed of an inorganic film on the particle cover layer.

Recently, as an organic light emitting display device has become thinner, the encapsulation layer has also become thinner. In detail, the particle cover layer in the encapsulation layer has become thinner. Thus, there is an area where the particle cover layer is not coated due to coverage of a lower thin film transistor pattern. The area where the particle cover layer is not coated is visible to the naked eye as mura or stain and thus causes an appearance defect of the OLED device and also deteriorates the reliability of the organic light emitting display device.

Accordingly, on the basis of understanding that the particle cover layer is coated by an inkjet method, the inventors of the present disclosure recognized that spreadability of an organic material of the particle cover layer varies depending on surface energy of a lower film and scan mura or defect occurs depending on the spreadability of the organic material.

In detail, as surface energy of a film coated with the organic material of the particle cover layer is increased, the spreadability of the organic material is increased. Also, if the spreadability of the organic material is increased, coverage of the particle cover layer can be improved.

Thus, the inventors of the present disclosure applied a second encapsulation layer capable of increasing the spreadability of the organic material between a first encapsulation layer and the particle cover layer adjacent to an organic light emitting element. Therefore, the inventors invented an organic light emitting display device with improvement in scan mura caused by the coating of the particle cover layer.

An aspect to be achieved by the present disclosure is to provide an organic light emitting display device in which a first encapsulation layer and a second encapsulation layer different from one another in surface energy are provided under a particle cover layer. Thus, it is possible to improve scan mura caused by the coating of the particle cover layer.

The aspects of the present disclosure are not limited to the aforementioned objects, and other objects, which are not mentioned above, will be apparent to a person having ordinary skill in the art from the following description.

According to an embodiment of the present disclosure, there is provided an organic light emitting display device. The organic light emitting display device comprises a substrate, an organic light emitting element on the substrate, a first encapsulation layer on the substrate and on the organic light emitting element to seal the organic light emitting element, a second encapsulation layer on the first encapsulation layer, a particle cover layer on the second encapsulation layer, and a third encapsulation layer on the second encapsulation layer and the particle cover layer. The first encapsulation layer and the second encapsulation layer are different from each other in surface energy. Therefore, in the organic light emitting display device according to an embodiment of the present disclosure, when the particle cover layer is coated, the second encapsulation layer is formed of a material having a higher surface energy than the first encapsulation layer. Thus, it is possible to improve on scan mura or defect.

According to another embodiment of the present disclosure, there is provided an organic light emitting display device. The organic light emitting display device comprises a substrate, an organic light emitting element on the substrate, a first inorganic layer on the organic light emitting element, a second inorganic layer on the first inorganic layer, an organic layer formed of the organic composition on the second inorganic layer, and a third inorganic layer on the organic layer. The second inorganic layer has a higher spreadability with respect of an organic composition of the organic layer than the first inorganic layer. Therefore, in the organic light emitting display device according to this another embodiment of the present disclosure, the second inorganic layer in contact with the organic layer has a high spreadability with respect to the organic material of the organic layer. Thus, it is possible to improve the reliability of the organic light emitting display device.

According to another embodiment of the present disclosure, there is provided a display device. The display device comprises a substrate having pixels containing organic light emitting elements, an encapsulation layer over the substrate to protect the organic light emitting from at least one of moisture and oxygen, and a particle cover layer on the encapsulation layer to provide coverage of undesirable particles or foreign matters created during a manufacturing process. The encapsulation layer having a surface characteristic that allow the particle cover layer to be formed thereon via an inkjet printing technique, which meets satisfy threshold spreadability requirements to minimize visible display defects. Therefore, in the organic light emitting display device according to this another embodiment of the present disclosure, encapsulation layer in contact with the particle cover layer has a required spreadability with respect to the organic material of the particle cover layer. Thus, it is possible to improve the reliability of the organic light emitting display device.

Details of these and other embodiments will be included in the detailed description of the invention and the accompanying drawings.

According to the present disclosure, a first encapsulation layer and a second encapsulation layer different from each other in surface energy are provided under a particle cover layer. Thus, when the particle cover layer is coated, spreadability of the particle cover layer with respect to a lower film is increased, so that it is possible to improve scan mura or defect caused by forming the particle cover layer. Therefore, it is possible to improve the appearance yield and reliability of the organic light emitting display device.

In addition, according to the present disclosure, the second encapsulation layer as a lower film of the particle cover layer is formed of a material having a higher surface energy and a smaller contact angle than the first encapsulation layer. Thus, the particle cover layer can be formed uniformly, so that it is possible to improve on scan mura or defect. Therefore, it is possible to improve the appearance and reliability of the organic light emitting display device.

In addition, according to the present disclosure, the second encapsulation layer is formed of silicon oxide or silicon oxynitride. Thus, the particle cover layer can be formed uniformly, so that it is possible to improve on scan mura or defect. Therefore, it is possible to improve the appearance and reliability of the organic light emitting display device.

In addition, according to the present disclosure, the particle cover layer is formed by an inkjet method. Thus, the processing time can be reduced. Therefore, it is possible to improve the productivity of the organic light emitting display device.

The effects of the present disclosure are not limited to the aforementioned effects, and various other effects are included in the present specification.

BRIEF DESCRIPTION OF THE SEVERAL VIEWS OF THE DRAWINGS

The accompanying drawings, which are included to provide a further understanding of the disclosure and are incorporated and constitute a part of this disclosure, illustrate embodiments of the disclosure and together with the description serve to explain various principles. In the drawings.

DETAILED DESCRIPTION

Figure 1:
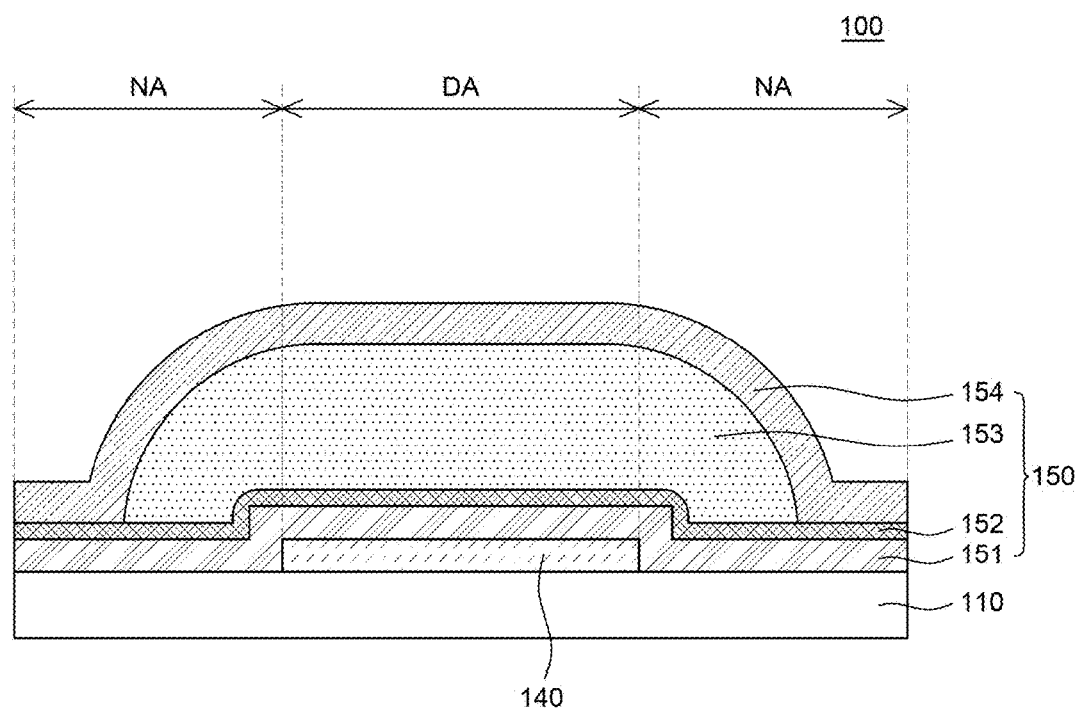
FIG. 1 is a schematic cross-sectional view of an organic light emitting display device according to an embodiment of the present disclosure.

Advantages and features of the present disclosure, and methods for accomplishing the same will be more clearly understood from embodiments described below with reference to the accompanying drawings. However, the present disclosure is not limited to the following embodiments but may be implemented in various different forms. The embodiments are provided only to complete disclosure of the present disclosure and to fully provide a person having ordinary skill in the art to which the present disclosure pertains with the category of the disclosure, and the present invention will be defined by the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since the size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways, and the embodiments can be carried out independently of or in association with each other.

Hereinafter, various embodiments of the present disclosure will be described with reference to the accompanying drawings.

Figure 2:
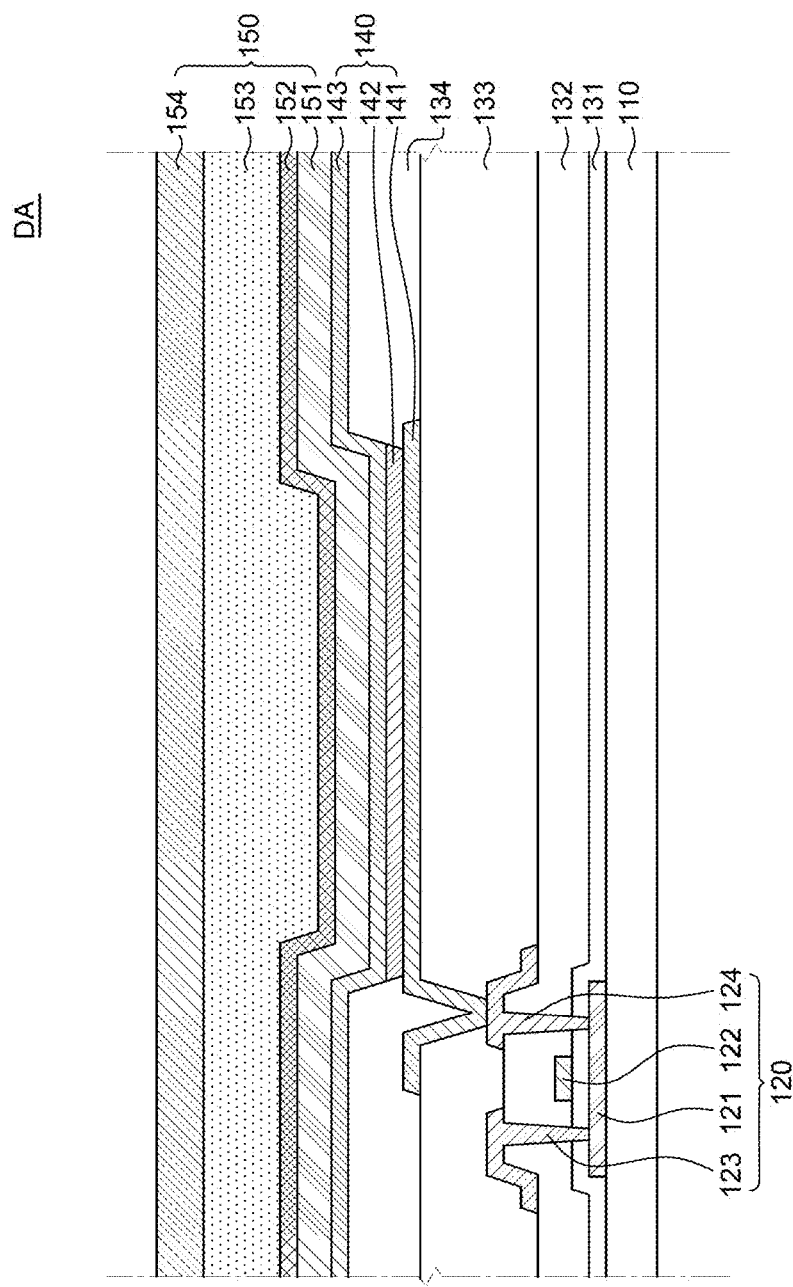
FIG. 2 is a schematic cross-sectional view provided to explain a configuration in a display area of FIG. 1.

FIG. 1 is a schematic cross-sectional view of an organic light emitting display device according to an embodiment of the present disclosure. FIG. 2 is a schematic cross-sectional view provided to explain a configuration in a display area of FIG. 1.

Referring to FIG. 1, an organic light emitting display device 100 according to an embodiment of the present disclosure includes a substrate 110, an organic light emitting element 140, and an encapsulation unit 150.

During a manufacturing process, the substrate 110 may be formed of an insulating material for supporting various components of the organic light emitting display device 100. For example, the substrate 110 may be formed of glass or plastic. And, the substrate 110 may have a flexible characteristic.

The substrate 110 includes a display area DA and a non-display area NA. The display area DA refers to an area where an image is displayed in the organic light emitting display device 100. Referring to FIG. 1 and FIG. 2, a thin film transistor (TFT) 120 and the organic light emitting element 140 are disposed in the display area DA. The display area DA is disposed in a central area of the substrate 110 and the non-display area NA is disposed to surround the display area DA. In this case, the non-display area NA may surround only a part of the display area DA. In the non-display area NA, various lines, circuits, and driving IC chips for driving the TFT 120 and the organic light emitting element 140 may be disposed.

Referring to FIG. 2, the TFT 120 includes an active layer 121, a gate electrode 122, a source electrode 123, and a drain electrode 124.

In detail, the active layer 121 is disposed in an area on the substrate 110. A gate insulation layer 131 is disposed between the active layer 121 and the gate electrode 122. The gate electrode 122 is disposed on the gate insulation layer 131 so as to be overlapped with the active layer 121. An interlayer insulation layer 132 is disposed on the gate electrode 122. The source electrode 123 and the drain electrode 124 are disposed on the interlayer insulation layer 132. The source electrode 123 and the drain electrode 124 are electrically connected to the active layer 121 through contact holes in the interlayer insulation layer 132. The gate insulation layer 131 and the interlayer insulation layer 132 may be disposed in the display area DA and may also be extended to a partial area of the non-display area NA adjacent to the display area DA. In an embodiment of the present disclosure, the TFT 120 is described as having a coplanar structure, but is not limited thereto, and various TFTs which can be applied in the organic light emitting display device 100 may be used. And, for convenience in explanation, FIG. 2 illustrates only the driving TFT 120 from among the TFTs which can be employed in the organic light emitting display device 100. However, a switching TFT or a TFT for performing another function may be further disposed in the display area.

An overcoating layer 133 is disposed on the TFT 120. The overcoating layer 133 functions as a planarization layer that flattens an upper part of the substrate 110. And, the overcoating layer 133 includes a contact hole for electrically connecting the TFT 120 and an anode 141 of the organic light emitting element 140. The overcoating layer 133 may be disposed in the display area DA and may also be extended to a partial area of the non-display area NA adjacent to the display area DA.

The organic light emitting element 140 is disposed on the overcoating layer 133. The organic light emitting element 140 is driven by the TFT 120 and includes the anode 141, an organic light emitting layer 142, and a cathode 143. An emission area of the organic light emitting layer 142 may be defined by a bank 134.

The anode 141 may be electrically connected to the TFT 120, e.g., the drain electrode 124 of the TFT 120, through the contact hole formed in the overcoating layer 133.

The anode 141 may be formed of a material for supplying holes to the organic light emitting layer 142. For example, the anode 141 may be formed of a transparent conductive oxide such as indium tin oxide (ITO) or indium zinc oxide (IZO). For example, if the organic light emitting display device 100 is of a top-emission type, the anode 141 may further include a reflective layer under the transparent conductive oxide in order to reflect a light emitted from the organic light emitting layer 142 upwards. However, the present disclosure is not limited thereto. The reflective layer may also be a component separate from the anode.

The organic light emitting layer 142 is formed of an organic material capable of emitting a light of a specific color. The organic light emitting layer 142 may be one among a red organic light emitting layer, a green organic light emitting layer, a blue organic light emitting layer, and a white organic light emitting layer. If the organic light emitting layer 142 is a white organic light emitting layer, i.e., the organic light emitting layer 142 emits a white light, the organic light emitting layer 142 may include a plurality of organic light emitting layers. Colors of lights respectively emitted from the plurality of organic light emitting layers are mixed to form a white color. If the organic light emitting layer 142 emits a white light, a color filter may be further disposed on the organic light emitting element 140. In an embodiment of the present disclosure, the organic light emitting layer 142 is described as being formed of a light emitting material that emits a light of any one color of red, blue, green, and white. However, the present disclosure is not limited thereto. The organic light emitting layer 142 may include a light emitting material that emits a light of another color.

And, an additional organic layer that facilitates the movement of holes and electrons may be disposed between the anode 141 and the cathode 143. For example, an organic layer such as a hole injection layer, a hole transport layer, an electron blocking layer, etc. may be disposed between the anode 141 and the organic light emitting layer 142. Also, an organic layer such as an electron injection layer, an electron transport layer, a hole blocking layer, etc. may be disposed between the organic light emitting layer 142 and the cathode 143.

The cathode 143 may be formed of a material for supplying electrons to the organic light emitting layer 142. The cathode 143 may be formed of a metal material or a transparent conductive oxide. For example, the cathode 143 may be formed of a metal material such as silver (Ag), magnesium (Mg), an alloy of silver and magnesium (Ag—Mg), etc., or a transparent conductive oxide such as IZO, ITO, etc.

The bank 134 is disposed on the overcoating layer 133 so as to cover a part of the anode 141. The bank 134 defines an emission area in the display area DA. The bank 134 may be disposed in the display area DA and may also be extended to a partial area of the non-display area NA adjacent to the display area DA.

Referring to FIG. 1 and FIG. 2, the encapsulation unit 150 is disposed on the entire surface of the substrate 110 including the display area DA and the non-display area NA. The encapsulation unit 150 is configured to protect the organic light emitting element 140 against moisture ($H_2O$) and oxygen ($O_2$) which may permeate from the outside. The encapsulation unit 150 includes a first encapsulation layer 151, a second encapsulation layer 152, a particle cover layer (PCL) 153, and a third encapsulation layer 154.

Referring to FIG. 1, the first encapsulation layer 151 is disposed in the display area DA and the non-display area NA and disposed on the organic light emitting element 140.

The first encapsulation layer 151 is formed of a transparent inorganic material which effectively blocks permeation of moisture into the organic light emitting element 140 and is suitable for low-temperature deposition. For example, the first encapsulation layer 151 may be formed of silicon nitride (SiNx). Since the first encapsulation layer 151 is formed of an inorganic material, it may also be referred to as a first inorganic layer. The first encapsulation layer 151 may be formed by chemical vapor deposition (CVD) or atomic layer deposition (ALD).

The second encapsulation layer 152 is disposed on the first encapsulation layer 151. The second encapsulation layer 152 is formed on an upper surface of the first encapsulation layer 151 in the display area DA and the non-display area NA. The second encapsulation layer 152 will be described in detail after the PCL 153 and the third encapsulation layer 154 are explained.

The PCL 153 is disposed on the second encapsulation layer 152. The PCL 153 is an organic layer capable of compensating a foreign matter which may be disposed in the PCL 153 during the manufacturing process. The PCL 153 is disposed on the display area DA and a partial area of the non-display area NA adjacent to the display area DA. In detail, the PCL 153 may become a permeation path of moisture or oxygen. Therefore, an end of the PCL 153 is positioned on the inner side than ends of the first encapsulation layer 151 and the second encapsulation layer 152. The PCL 153 is almost flat in an area where the organic light emitting element 140 is disposed, but has a shape which becomes gradually thinner toward an area adjacent to the non-display area NA of the substrate 110 where the organic light emitting element 140 is not disposed. In this case, a portion of the PCL 153 being gradually thinner may be referred to as a slope. An area where the slope is formed refracts a light, so that image quality may deteriorate. Therefore, the area where the slope is formed needs to be formed in the non-display area NA where the organic light emitting element 140 is not disposed.

The PCL 153 functions to cover a foreign matter or a particle which may be generated during the process. And, the first encapsulation layer 151 or the second encapsulation layer 152 may have a defect caused by a crack generated by the foreign matter or the particle. In this case, the PCL 153 may function to cover the crack generated by the foreign matter or the particle. In order for the PCL 153 to effectively compensate the foreign matter, the PCL 153 may have a viscosity of, e.g., 30 cP (1 cP=1 mPa·s) or less.

The PCL 153 is formed of an organic material. Therefore, the PCL 153 may be referred to as an organic layer. For example, the PCL 153 may be formed using acryl-based resin or epoxy-based resin, but is not limited thereto.

The thickness of the PCL 153 may be adjusted in consideration of thinning of the organic light emitting display device 100. For example, the thickness of the PCL 153 may be in the range of 5 µm to 15 µm, and in detail, may be 8 µm.

The PCL 153 may be formed on the second encapsulation layer 152 using an inkjet method. For example, the PCL 153 may be formed using the inkjet method by dropping an organic material constituting the PCL 153 in a liquid state on the second encapsulation layer 152 through a nozzle at an inkjet head. The organic material dropped on the substrate 110 through the nozzle is spread to an area where the nozzle is not positioned so as to cover the second encapsulation layer 152 disposed in the display area DA. The number of nozzles, the amount of the organic material to be injected through the nozzles, and a speed of the inkjet head may be adjusted depending on the thickness and the area of the PCL 153. And, the inkjet method does not require a mask and reduces the processing time for forming the PCL 153. Thus, the productivity of the organic light emitting display device 100 can be improved.

The third encapsulation layer 154 is disposed on the second encapsulation layer 152 and the PCL 153. The third encapsulation layer 154 is disposed in the display area DA and the non-display area NA of the substrate 110. In detail, an end of the third encapsulation layer 154 is disposed on the outside of the PCL 153 rather than on the end of the PCL 153. Therefore, the second encapsulation layer 152 and the third encapsulation layer 154 may be configured to be in direct contact at an edge of the substrate 110 and more specifically, at an outer area of the non-display area NA of the substrate 110. For example, the second encapsulation layer 152 and the third encapsulation layer 154 adjacent to each other may be configured to seal the PCL 153.

The third encapsulation layer 154 is formed of a transparent inorganic material which is excellent in blocking permeation of moisture into the organic light emitting element 140 and suitable for low-temperature deposition. The third encapsulation layer 154 may be formed of the same material as the first encapsulation layer 151. For example, the third encapsulation layer 154 may be formed of silicon nitride (SiNx). Since the third encapsulation layer 154 may be formed of an inorganic material, it may be referred to as a third inorganic layer. The third encapsulation layer 154 may be formed by chemical vapor deposition (CVD) or atomic layer deposition (ALD) in the same manner as the first encapsulation layer 151.

The thickness of the third encapsulation layer 154 may be adjusted in consideration of transmittance and encapsulation property. For example, the thickness of the third encapsulation layer 154 may be in the range of 0.5 µm to 1.5 µm, and in detail, may be 1 µm.

And, ends of the first to third encapsulation layers 151, 152, and 154 may be aligned with or adjacent to an end of the substrate 110. Thus, it is possible to effectively reduce permeation of moisture or oxygen along an interface of the organic light emitting display device 100 caused by peeling-off of the encapsulation unit 150 in a subsequent process. However, the structure of the first to third encapsulation layers 151, 152, and 154 is not necessarily limited thereto, and may be modified in various ways depending on a design of the organic light emitting display device.

Meanwhile, the second encapsulation layer 152 is formed of a material different in surface energy from that of the first encapsulation layer 151. In detail, the second encapsulation layer 152 is formed of an inorganic material having a higher surface energy than the first encapsulation layer 151. For example, the second encapsulation layer 152 may be formed of silicon oxynitride (SiOxNy) or silicon oxide (SiOx). The silicon oxynitride may be, e.g., SiON. Since the second encapsulation layer 152 may be formed of an inorganic material, it may also be referred to as a second inorganic layer.

Herein, the surface energy can be defined as energy that attracts an external material with attraction of atoms in the outermost layer. For example, as the surface energy of a film is increased, the spread of a liquid can be accelerated. Therefore, as the second encapsulation layer 152 has a higher surface energy than the first encapsulation layer 151, the spread of the organic material disposed on the second encapsulation layer 152 in a liquid state to form the PCL 153 can be accelerated. Therefore, the second encapsulation layer 152 may have/support a higher spreadability of the organic material than the first encapsulation layer 151. Herein, the spreadability refers to the degree of spread of a liquid when the liquid is dropped onto a surface of a specific layer. Accordingly, in an embodiment of the present disclosure, the second encapsulation layer 152 having a higher surface energy than the first encapsulation layer 151 is disposed. Thus, when the PCL 153 is disposed on the second encapsulation layer 152, the spread of the organic material constituting the PCL 153 can be accelerated.

For example, silicon nitride (SiNx) constituting the first encapsulation layer 151 has surface energy of about 60 mN/m. Thus, the second encapsulation layer 152 may be formed of a material having a higher surface energy than the first encapsulation layer 151. For example, as described above, silicon oxynitride (SiOxNy) or silicon oxide (SiOx) constituting the second encapsulation layer 152 may have surface energy of 70 mN/m or more. And, the silicon oxynitride may be, e.g., SiON.

In an organic light emitting display device without the second encapsulation layer 152, when the PCL is formed, the organic material constituting the PCL is not uniformly spread on the first encapsulation layer, so that scan mura or defect may occur. Herein, the scan mura refers to a dot or line-shaped spot that occurs in a portion which is not coated since the organic material constituting the PCL 153 is not uniformly spread when the PCL 153 is formed. For example, if an inorganic layer formed of silicon nitride (SiNx) is disposed under the PCL 153, when the PCL 153 is formed, the organic material in a liquid state may not be uniformly spread but may be agglomerated. Thus, mura or defect can be recognized.

In the organic light emitting display device 100 according to an embodiment of the present disclosure, the second encapsulation layer 152 can reduce the occurrence of scan mura. For example, the second encapsulation layer 152 having a higher surface energy than the first encapsulation layer 151 is disposed between the first encapsulation layer 151 and the PCL 153. Thus, when the PCL 153 is formed, the organic material in a liquid state can be uniformly spread on the first encapsulation layer 151.

The second encapsulation layer 152 may be an inorganic layer having a contact angle (or wetting angle) of 20° or less. Herein, the contact angle may be defined as an angle at a contact interface between a surface of the second encapsulation layer 152 and water. For example, when water in thermodynamic equilibrium on the surface of the second encapsulation layer 152, the angle between the surface of the second encapsulation layer 152 and the water may be defined as the contact angle. For example, if the second encapsulation layer 152 is formed of silicon oxynitride (SiON), the contact angle of the second encapsulation layer 152 may be in the range of 14° to 19°. If the second encapsulation layer 152 is formed of silicon oxide (SiOx), the contact angle of the second encapsulation layer 152 may be in the range of 12° to 14°. For example, as a contact angle between the second encapsulation layer 152 and the PCL on the second encapsulation layer 152 is decreased, the spreadability of the PCL may be improved.

The second encapsulation layer 152 has a lower impact on the encapsulation characteristics than the first encapsulation layer 151 and is used as a buffer layer for improving the spreadability of the organic material when the PCL 153 is coated. Therefore, the second encapsulation layer 152 may have a thinner thickness than the first encapsulation layer 151.

The thickness of the second encapsulation layer 152 may be adjusted depending on the thickness of the first encapsulation layer 151. For example, the second encapsulation layer 152 may have a thickness of 0.01 µm to 1 µm. For example, the second encapsulation layer 152 may have a small thickness in order to reduce the thickness of the encapsulation unit 150. And, the first encapsulation layer 151 and the second encapsulation layer 152 may have a small thickness in order to reduce an effect on the transmittance of the organic light emitting display device 100. The sum of the thicknesses of the first encapsulation layer 151 and the second encapsulation layer 152 may be in the range of about 0.8 µm to about 3 µm, but is not limited thereto.

The second encapsulation layer 152 may be formed by chemical vapor deposition (CVD) or atomic layer deposition (ALD) in the same manner as the first encapsulation layer 151. The second encapsulation layer 152 is formed to have a thinner thickness than the first encapsulation layer 151. Thus, the ALD may make it easier to form the second encapsulation layer 152 with a small thickness.

The encapsulation unit 150 of the organic light emitting display device 100 according to an embodiment of the present disclosure includes the second encapsulation layer 152 under the PCL 153. The second encapsulation layer 152 has a higher surface energy than the first encapsulation layer 151 and thus has/support a higher spreadability of the organic material and a small contact angle. Therefore, when the PCL 153 is formed by the inkjet method, the spreadability of the organic material constituting the PCL 153 can be improved and scan mura caused by coating of the PCL 153 can be reduced. Therefore, the appearance yield of the organic light emitting display device 100 according to an embodiment of the present disclosure can be improved. Herein, the appearance yield of an organic light emitting display device refers to a defect rate in a visual inspection for checking defects of a manufactured organic light emitting display device from the outside.

Figure 3:
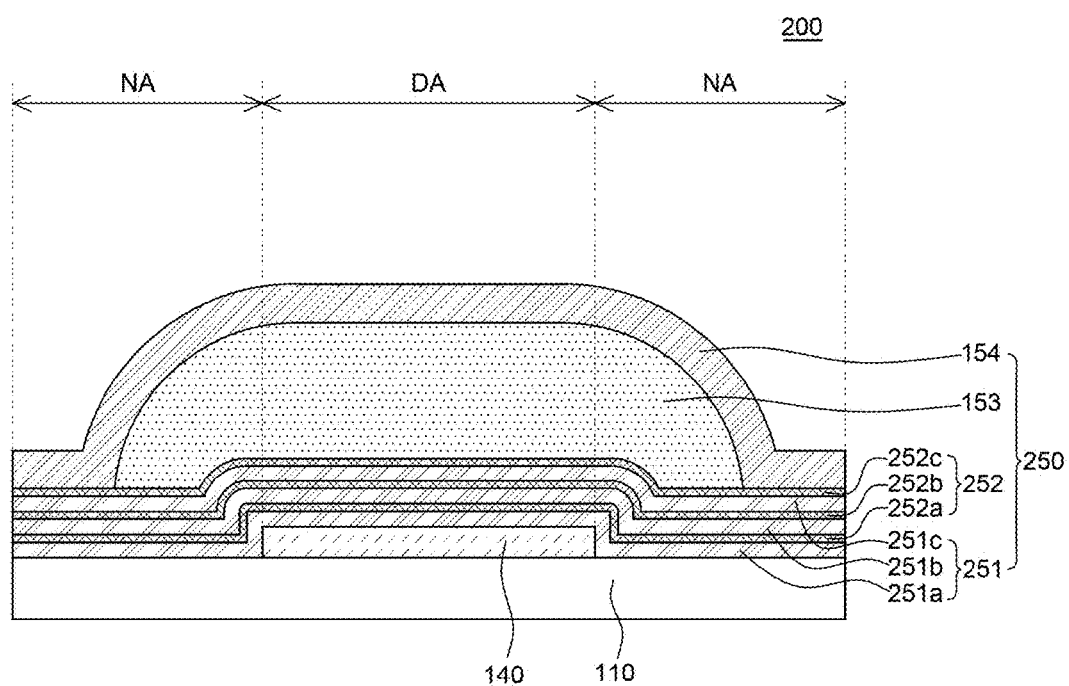
FIG. 3 is a schematic cross-sectional view of an organic light emitting display device according to another embodiment of the present disclosure.

FIG. 3 is a schematic cross-sectional view of an organic light emitting display device according to another embodiment of the present disclosure.

Referring to FIG. 3, an organic light emitting display device 200 according to another embodiment of the present disclosure includes the substrate 110, the organic light emitting element 140, and an encapsulation unit 250.

The organic light emitting display device 200 illustrated in FIG. 3 is substantially the same as the organic light emitting display device 100 illustrated in FIG. 1 except a lamination structure of a first encapsulation layer 251 and a second encapsulation layer 252. Therefore, redundant description thereof will be omitted, but only differences therebetween will be described.

The encapsulation unit 250 includes a first encapsulation layer 251, a second encapsulation layer 252, the PCL 153, and the third encapsulation layer 154.

In this case, the first encapsulation layer 251 includes multiple first encapsulation layers, and the second encapsulation layer 252 includes multiple second encapsulation layers. The multiple first encapsulation layers and the multiple second encapsulation layers are alternately repeatedly formed. For descriptive purposes, each individual first encapsulation layer may be referred to as a sub-encapsulation layer and individual second encapsulation layer may be referred to as a sub-encapsulation layer. For example, as illustrated in FIG. 3, a first sub-encapsulation layer 251a of the first encapsulation layer 251, a first sub-encapsulation layer 252a of the second encapsulation layer 252, a second sub-encapsulation layer 251b of the first encapsulation layer 251, a second sub-encapsulation layer 252b of the second encapsulation layer 252, a third sub-encapsulation layer 251c of the first encapsulation layer 251, and a third subshown in the following Table 1. Also, a PCL coated on the second encapsulation layer by the inkjet method to a thickness of 8 μm and a third encapsulation layer formed of silicon nitride (SiNx) to a thickness of 1.0 μm are laminated. Herein, the second encapsulation layer is in contact with the PCL.

Table 1 shows the compositions and the thicknesses of the first encapsulation layer, the second encapsulation layer, the PCL, and the third encapsulation layer of the organic light emitting display device according to each of first embodiment, second embodiment, and Comparative Example 1.

TABLE 1

|  | First Encapsulation Layer | | Second Encapsulation Layer | | Particle Cover Layer (PCL) | | Third Encapsulation Layer | |
| --- | --- | --- | --- | --- | --- | --- | --- | --- |
|  | Composition | Thickness (μm) | Composition | Thickness (μm) | Composition | Thickness (μm) | Composition | Thickness (μm) |
| Comparative Example | SiNx (Ref) | 0.82 | — | — | Polymer | 8 | SiNx | 1.0 |
| First Embodiment | SiNx | 0.77 | SiON | 0.05 | Polymer | 8 | SiNx | 1.0 |
| Second Embodiment | SiNx | 0.75 | SiOx | 0.07 | Polymer | 8 | SiNx | 1.0 | encapsulation layer 252c of the second encapsulation layer 252 are disposed in series on the organic light emitting element 140. FIG. 3 illustrates that the first encapsulation layer 251 and the second encapsulation layer 252 are repeatedly laminated three times. However, the present disclosure is not limited thereto. The number of laminated layers may vary as long as the first encapsulation layer 251 and the second encapsulation layer 252 are alternately formed at least two times. Herein, a layer in contact with the PCL 153 is a sub-encapsulation layer of the second encapsulation layer 252.

And, the thickness of each layer of the first encapsulation layer 251 and the second encapsulation layer 252 can be appropriately adjusted depending on the number of times of lamination and the transmittance of the encapsulation unit 250.

As such, in the organic light emitting display device 200 according to another embodiment of the present disclosure, the PCL 153 is disposed to be in contact with the second encapsulation layer 252 having a higher surface energy than the first encapsulation layer 251. Thus, when the PCL 153 is formed, scan mura or defect caused by coating of the organic material can be improved. Therefore, the reliability of the organic light emitting display device 200 can be improved.

Hereinafter, organic light emitting display devices respectively manufactured according to first embodiment, second embodiment, and Comparative Example will be described to discuss the effect of the present disclosure.

First embodiment is an organic light emitting display device in which a second encapsulation layer is formed of silicon oxynitride (SiON), and the organic light emitting display device has the structure illustrated in FIG. 1. Second embodiment is an organic light emitting display device in which a second encapsulation layer is formed of silicon oxide (SiOx), and the organic light emitting display device has the structure illustrated in FIG. 1. Comparative Example has the structure illustrated in FIG. 1 except the second encapsulation layer. In first embodiment, second embodiment, and Comparative Example, a first encapsulation layer and a second encapsulation layer have the compositions as Table 2 shows the contact angles, the result of surface energy analysis, and the result of scan mura defect rate (%) of the organic light emitting display device according to each of first embodiment, second embodiment, and Comparative Example. Herein, DI denotes a water contact angle and DM denotes an oil contact angle.

TABLE 2

|  | Contact angle (°) | | Result of surface energy analysis (mN/m) | | | Scan mura defect rate (%) |
| --- | --- | --- | --- | --- | --- | --- |
|  | DI | DM | Surface energy | Diffusion | Polarization |  |
| Comparative Example | 41 | 48 | 61 | 35 | 26 | 2.46 |
| First Embodiment | 19 | 48 | 72 | 35 | 36 | 0 |
| Second Embodiment | 13 | 39 | 75 | 40 | 35 | 0 |

Referring to Table 1 and Table 2, in first embodiment and second embodiment where the second encapsulation layer in contact with the PCL is formed of silicon oxynitride (SiON) or silicon oxide (SiOx), the conditions for the second encapsulation layer of the present disclosure, i.e., the water contact angle of 20° or less and the surface energy of 70 mN/m or more, are satisfied. Also, it can be seen that the defect rate of the scan mura or defect is 0%. In an example, such conditions for the second encapsulation layer of the present disclosure, i.e., the water contact angle of 20° or less and the surface energy of 70 mN/m or more may be set up as a spreadability threshold requirement for the second encapsulation layer (or material characteristic of the second encapsulation layer). It should be appreciated that for a different organic cover layer, e.g., of different organic materials, a different spreadability threshold requirement may be set up for the second encapsulation layer, which are also included in the disclosure.

However, in Comparative Example where only the first encapsulation layer formed of silicon nitride (SiNx) in contact with the PCL is disposed, the water contact angle is 41° and the surface energy is 61 mN/m, which causes scan mura or defect. Thus, it can be seen that the defect rate of the scan mura or defect of the organic light emitting display device is as relatively high as 2.46%.

Therefore, when the PCL is formed on silicon oxynitride (SiON) or silicon oxide (SiOx) having a water contact angle of 20° or less and surface energy of 70 mN/m or more by the inkjet method, the PCL can be uniformly distributed, so that the occurrence of scan mura or defect can be reduced.

Figure 4:
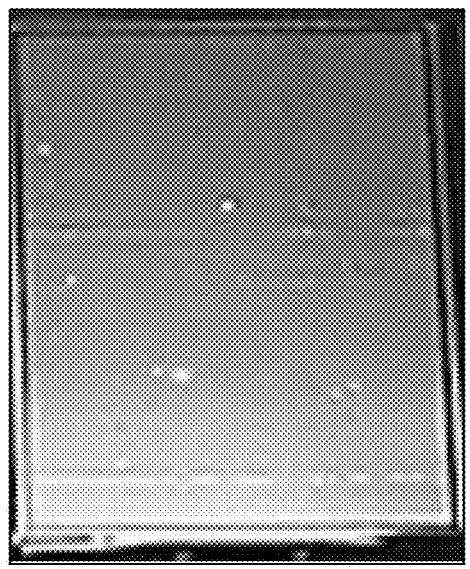
FIG. 4 is a photo of a surface of an organic light emitting display device according to Comparative Example 1 of the present disclosure.
Figure 5:
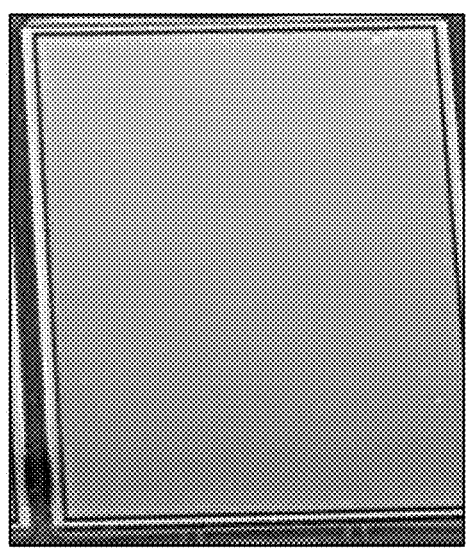
FIG. 5 is a photo of a surface of an organic light emitting display device according to Examples 1 and 2 of the present disclosure.

FIG. 4 is a photograph of a surface of an organic light emitting display device according to Comparative Example. FIG. 5 is a photograph of a surface of an organic light emitting display device according to first embodiment and second embodiment of the present disclosure.

Referring to FIG. 4 and FIG. 5, white dot or line-shaped scan mura can be observed with the naked eye from a surface of the organic light emitting display device according to Comparative Example. However, no scan mura or defect is observed with the naked eye from a surface of the organic light emitting display device according to first embodiment and second embodiment, resulting in good appearance.

Accordingly, in the organic light emitting display device according to embodiments of the present disclosure, if an encapsulation layer in contact with a PCL is formed as a film or a layer having a high surface energy or a small water contact angle, scan mura or defect caused by coating of the PCL by the inkjet method can be improved.

The embodiments of the present disclosure can also be described as follows:

According to an embodiment of the present disclosure, an organic light emitting display device includes an organic light emitting element on a substrate, a first encapsulation layer on the substrate and on the organic light emitting element to seal the organic light emitting element, a second encapsulation layer on the first encapsulation layer, a particle cover layer on the second encapsulation layer, and a third encapsulation layer on the second encapsulation layer and the particle cover layer. The first encapsulation layer and the second encapsulation layer are different from each other in surface energy. Therefore, scan mura caused by coating of the particle cover layer can be improved, so that the appearance yield and reliability of a product can be improved.

According to one or more embodiments of the present disclosure, the second encapsulation layer may have a higher surface energy than the first encapsulation layer.

According to one or more embodiments of the present disclosure, the second encapsulation layer may include at least one among silicon oxynitride (SiOxNy) or silicon oxide (SiOx).

According to one or more embodiments of the present disclosure, the second encapsulation layer may have surface energy of 70 mN/m or more.

According to one or more embodiments of the present disclosure, the second encapsulation layer may have a water contact angle of 20° or less.

According to one or more embodiments of the present disclosure, the first encapsulation layer and the third encapsulation layer may be formed of silicon nitride (SiNx).

According to one or more embodiments of the present disclosure, the second encapsulation layer may have a thinner thickness than the first encapsulation layer.

According to one or more embodiments of the present disclosure, the organic light emitting display device may comprise multiple first encapsulation layers and multiple second encapsulation layers, the multiple first encapsulation layers and the multiple second encapsulation layers may be alternately formed repeatedly at least two times.

According to one or more embodiments of the present disclosure, the second encapsulation layer may be in contact with the particle cover layer.

According to one or more embodiments of the present disclosure, the first encapsulation layer, the second encapsulation layer, and the third encapsulation layer may be laminated/stacked on at edge area of the substrate.

According to another embodiment of the present disclosure, an organic light emitting display device includes an organic light emitting element on a substrate, a first inorganic layer on the organic light emitting element, a second inorganic layer on the first inorganic layer, an organic layer formed of the organic composition on the second inorganic layer, and a third inorganic layer on the organic layer. The second inorganic layer has a higher spreadability with respect to an organic composition constituting the organic layer than the first inorganic layer.

According to one or more embodiments of the present disclosure, the organic layer may be formed by an inkjet method.

According to one or more embodiments of the present disclosure, the first inorganic layer and the third inorganic layer may be formed of silicon nitride (SiNx), and the second inorganic layer may be formed of at least one among silicon oxynitride (SiOxNy) or silicon oxide (SiOx).

According to another embodiment of the present disclosure, there is provided a display device. The display device comprises a substrate having pixels containing organic light emitting elements, an encapsulation layer over the substrate to protect the organic light emitting from at least one among moisture and oxygen, and a particle cover layer on the encapsulation layer to provide coverage of undesirable particles or foreign matters created during a manufacturing process. The encapsulation layer having a surface characteristic that allow the particle cover layer to be formed thereon via an inkjet printing technique, which meets a threshold spreadability requirement to minimize visible display defects.

According to one or more embodiments of the present disclosure, the encapsulation layer may include a laminated stack comprising a first sub-layer and a second sub-layer thereon. The surface characteristic of the second sub-layer having at least one of a surface energy of 70 mN/m or more and a water contact angle of 20° or less.

According to one or more embodiments of the present disclosure, the second sub-layer may include at least one among silicon oxynitride (SiOxNy) or silicon oxide (SiOx).

According to one or more embodiments of the present disclosure, the second sub-layer may be thinner than the first sub-layer.

According to one or more embodiments of the disclosure, the encapsulation layer may contain a plurality of laminated stacks of the first and second sub-layers that are made of inorganic materials, and an organic layer between the laminated stacks.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display device, comprising:
   an organic light emitting element on a display area of a substrate;
   a first encapsulation layer on the substrate and on the organic light emitting element to seal the organic light emitting element;
   a second encapsulation layer on the first encapsulation layer, the second encapsulation layer having a different surface energy than the first encapsulation layer;
   a particle cover layer on the second encapsulation layer, the particle cover layer extending from the display area to a non-display area of the substrate, and the particle cover layer having a top surface that is almost flat within the display area and having a sloped top surface in at least some regions in the non-display area, the particle cover layer being thinner in at least some regions in the non-display area than in the display area; and
   a third encapsulation layer on the particle cover layer;
   wherein the first encapsulation layer and the second encapsulation layer extend beyond an outmost edge of the particle cover layer, and the third encapsulation layer is directly laminated on the second encapsulation layer at an edge area of the substrate.

2. The organic light emitting display device according to claim 1, wherein the second encapsulation layer has a higher surface energy than the first encapsulation layer.

3. The organic light emitting display device according to claim 1, wherein the second encapsulation layer includes at least one among silicon oxynitride (SiOxNy) or silicon oxide (SiOx).

4. The organic light emitting display device according to claim 1, wherein the second encapsulation layer has a water contact angle of 20° or less.

5. The organic light emitting display device according to claim 1, wherein the first encapsulation layer and the third encapsulation layer are formed of silicon nitride (SiNx).

6. The organic light emitting display device according to claim 1, wherein the second encapsulation layer has a thinner thickness than the first encapsulation layer.

7. The organic light emitting display device according to claim 1, comprising multiple first encapsulation layers and multiple second encapsulation layers, the multiple first encapsulation layers and the multiple second encapsulation layers being alternately formed repeatedly at least two times.

8. The organic light emitting display device according to claim 1, wherein the second encapsulation layer is in contact with the particle cover layer.

9. The organic light emitting display device according to claim 6, wherein the second encapsulation layer is between 10 times and 100 times thinner than the first encapsulation layer.

10. The organic light emitting display device according to claim 9, wherein the particle cover layer is between five and twenty times thicker than the first encapsulation layer.

11. The organic light emitting display device according to claim 10, wherein the particle cover layer is between ten and twenty times thicker than the first encapsulation layer.

12. An organic light emitting display device, comprising:
    an organic light emitting element on a display area of a substrate;
    a first encapsulation layer on the substrate and on the organic light emitting element to seal the organic light emitting element;
    a second encapsulation layer on the first encapsulation layer, the second encapsulation layer having a different surface energy than the first encapsulation layer;
    a particle cover layer on the second encapsulation layer, the particle cover layer extending from the display area to a non-display area of the substrate, and the particle cover layer having a top surface that is almost flat within the display area and having a sloped top surface in at least some regions in the non-display area, the particle cover layer being thinner in at least some regions in the non-display area than in the display area; and
    a third encapsulation layer on the particle cover layer,
    wherein the first encapsulation layer and the second encapsulation layer extend beyond an outmost edge of the particle cover layer, and the third encapsulation layer is directly laminated on the second encapsulation layer at an edge area of the substrate, wherein the second encapsulation layer has a surface energy of at least 70 mN/m.

13. The organic light emitting display device according to claim 12, wherein the second encapsulation layer has a surface energy of greater than 70 mN/m and less than 76 mN/m.

14. An organic light emitting display device, comprising:
    a substrate having a display area and a non-display area;
    an organic light emitting element on the substrate in the display area;
    a first inorganic layer on the organic light emitting element, the first inorganic layer over the display area and extending into the non-display area;
    a second inorganic layer on the first inorganic layer, the second inorganic layer over the display area and extending into the non-display area and the second inorganic layer having a higher spreadability with respect to an organic composition positioned thereon than the first inorganic layer with respect to the organic composition;
    an organic layer formed of the organic composition on the second inorganic layer, the organic layer over the display area and extending into the non-display area, the organic layer having a uniform thickness within the display area and having a decreased thickness in regions extending into the non-display area, the organic layer being thinner in at least some regions in the non-display area than in the display area; and a third inorganic layer on the organic layer.

15. The organic light emitting display device according to claim 14, wherein the organic layer is formed by an inkjet method.

16. The organic light emitting display device according to claim 14, wherein the first inorganic layer and the third inorganic layer are formed of silicon nitride SiNx, and the second inorganic layer is formed of at least one among a silicon oxynitride composition of SiOxNy or a silicon oxide composition of SiOx.

17. The organic light emitting display device according to claim 14, wherein the second inorganic layer is thinner than the first inorganic layer, and a combined thickness of the first and second inorganic layers is equal to or less than a thickness of an encapsulation layer of a conventional display device that lacks said second inorganic layer.

18. The organic light emitting display device according to claim 17, wherein the second inorganic layer is between 10 times and 100 times thinner than the first inorganic layer.

19. The organic light emitting display device according to claim 18, wherein the organic layer has a thickness that is between five and twenty times thicker than the first inorganic layer.

20. A display device, comprising:
a substrate having pixels containing organic light emitting elements in a display area and having a non-display area adjacent to the display area;
an encapsulation layer on the substrate and on the organic light emitting elements to protect the organic light emitting elements from at least one of moisture and oxygen;
a particle cover layer on the encapsulation layer to provide coverage of undesirable particles or foreign matters created during a manufacturing process, the encapsulation layer having a surface characteristic that allow the particle cover layer to be formed thereon via an inkjet printing technique, the particle cover layer extending from the display area to the non-display area of the substrate, and the particle cover layer having a top surface that is almost flat within the display area and having a sloped top surface outside the display area in the non-display area, the particle cover layer becoming gradually thinner in the non-display area and being thinner in some regions in the non-display area than it is the display area; and
a third encapsulation layer on the particle cover layer.

21. A display device, comprising:
a substrate having pixels containing organic light emitting elements in a display area and having a non-display area adjacent to the display area;
an encapsulation layer over the substrate to protect the organic light emitting elements from at least one of moisture and oxygen;
a particle cover layer on the encapsulation layer to provide coverage of undesirable particles or foreign matters created during a manufacturing process, the encapsulation layer having a surface characteristic that allow the particle cover layer to be formed thereon via an inkjet printing technique, the particle cover layer extending from the display area to the non-display area of the substrate, and the particle cover layer having a top surface that is almost flat within the display area and having a sloped top surface outside the display area in the non-display area, the particle cover layer becoming gradually thinner in the non-display area and being thinner in some regions in the non-display area than it is the display area; and
a third encapsulation layer on the particle cover layer, wherein the encapsulation layer includes a laminated stack comprising a first sub-layer and a second sub-layer thereon, the second sub-layer having at least one of a surface energy of at least 70 mN/m and a water contact angle of 20° or less.

22. The device of claim 21, wherein the second sub-layer includes at least one among a silicon oxynitride composition of SiOxNy or a silicon oxide composition of SiOx.

23. The device of claim 21, wherein the second sub-layer is thinner than the first sub-layer.

24. The device of claim 23, wherein the encapsulation layer contains a plurality of laminated stacks of the first and second sub-layers that are made of inorganic materials, and an organic layer between the laminated stacks.

25. The device according to claim 21, wherein an end of the first sub-layer, an end of the second sub-layer and an end of the third encapsulation layer are all aligned with an end of the substrate.

26. The device according to claim 25, wherein the particle cover layer has a viscosity of 30 cP or less, where 1 cP=1 mPa*s, and the particular composition and the particular thickness of the second sub-layer is determined based upon said viscosity of the particle cover layer.

27. An organic light emitting display device, comprising:
an organic light emitting element on a display area of a substrate;
a first encapsulation layer on the substrate and on the organic light emitting element to seal the organic light emitting element, the first encapsulation layer having a first thickness;
a second encapsulation layer on the first encapsulation layer, the second encapsulation layer having a different surface energy than the first encapsulation layer, the second encapsulation layer having a second thickness that is at least ten times thinner than the first encapsulation layer;
a particle cover layer on the second encapsulation layer, the particle cover layer having a third thickness that is at least twice as thick at the first encapsulation layer; and
a third encapsulation layer on the particle cover layer, the third encapsulation layer having a fourth thickness that is less than half the thickness of the particle cover layer.

28. The organic light emitting display device according to claim 27, wherein the second encapsulation layer is between 10 times and 100 times thinner than the first encapsulation layer.

29. The organic light emitting display device according to claim 28, wherein the particle cover layer has a thickness that is between five and twenty times thicker than the first encapsulation layer.

* * * * *